(12) United States Patent
Nelson

(10) Patent No.: US 11,139,273 B2
(45) Date of Patent: Oct. 5, 2021

(54) DYNAMICALLY CONFIGURABLE MULTI-CHIP PACKAGE

(71) Applicant: INTEL CORPORATION, Santa Clara, CA (US)

(72) Inventor: Michael D. Nelson, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 16/573,266

(22) Filed: Sep. 17, 2019

(65) Prior Publication Data

US 2021/0082875 A1   Mar. 18, 2021

(51) Int. Cl.
*H01L 25/065* (2006.01)
*H01L 25/18* (2006.01)
*H01L 23/525* (2006.01)

(52) U.S. Cl.
CPC ...... *H01L 25/0657* (2013.01); *H01L 23/5256* (2013.01); *H01L 25/18* (2013.01); *H01L 2225/06506* (2013.01); *H01L 2225/06513* (2013.01); *H01L 2225/06527* (2013.01); *H01L 2225/06537* (2013.01); *H01L 2225/06541* (2013.01); *H01L 2225/06562* (2013.01); *H01L 2225/06575* (2013.01); *H01L 2225/06586* (2013.01)

(58) Field of Classification Search
CPC . H01L 25/0657; H01L 25/18; H01L 23/5256; H01L 2225/06506; H01L 2225/06513; H01L 2225/06537; H01L 2225/06541
See application file for complete search history.

(56) References Cited

U.S. PATENT DOCUMENTS

| 8,681,573 B2 | 3/2014 | Hafez et al. |
| 8,923,030 B2 | 12/2014 | Sandri et al. |
| 2010/0078635 A1* | 4/2010 | Kuroda ............... G11C 5/02 257/48 |
| 2017/0358564 A1* | 12/2017 | Lee ............... H01L 25/0657 |

* cited by examiner

*Primary Examiner* — Marc Anthony Armand
(74) *Attorney, Agent, or Firm* — Compass IP Law PC

(57) ABSTRACT

A semiconductor die includes one or more semiconductor devices (e.g., memory array, processors), first and second banks of I/O ports arranged along one or more sides of the die, and a multiplexing circuit. The multiplexing circuit can be changed between a first state and a second state. In the first state the first bank of I/O ports is coupled to the semiconductor device(s) and the second bank of I/O ports is not coupled to the semiconductor device(s), and in the second state the first bank of I/O ports is not coupled to the semiconductor device(s) and the second bank of I/O ports is coupled to the semiconductor device(s). The state of the multiplexing circuit can be set, for example, by an on-die fuse circuit or an externally accessible select line. The semiconductor die can be included in a chip package, which can be included on a printed circuit board.

20 Claims, 11 Drawing Sheets

DYNAMICALLY CONFIGURABLE MULTI-CHIP PACKAGE

BACKGROUND

Memory devices may be packaged in a number of different configurations. For example, chip packages can vary by die count (e.g., single die packages (SDPs), dual die packages (DDPs), quad die packages (QDPs), etc.) and by the number of simultaneous channels that are supported based on the number and arrangement of the input/output (I/O) ports (e.g., single channel, dual channel, quad channel devices, etc). Each of these variations requires a different package design to ensure correct routing of the data signals to/from the various dies within the package. Furthermore, a wide variety of end product configurations that use memory media may require different memory packages to be used. To this end, there are a number of unresolved issues that complicate the sourcing of memory devices.

BRIEF DESCRIPTION OF THE DRAWINGS

Features and advantages of embodiments of the claimed subject matter will become apparent as the following Detailed Description proceeds, and upon reference to the Drawings, in which:

Figure 1:
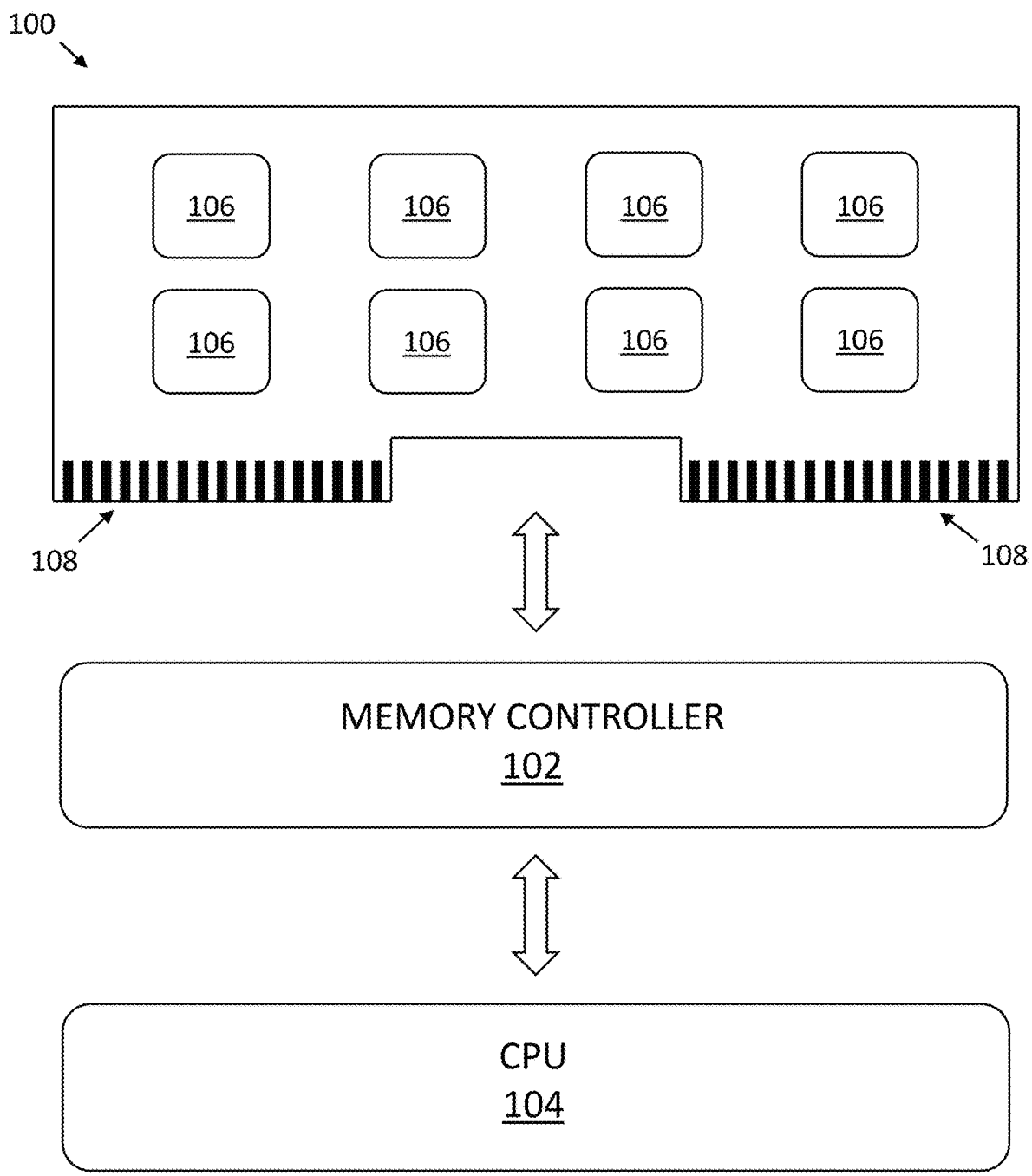
FIG. 1 illustrates a memory system architecture having a memory sub-system communicating with a memory controller and a central processing unit (CPU), configured in accordance with some embodiments of the present disclosure.

Although the following Detailed Description will proceed with reference being made to illustrative embodiments, many alternatives, modifications, and variations thereof will be apparent in light of this disclosure.

DETAILED DESCRIPTION

A semiconductor die includes one or more semiconductor devices (e.g., memory array, processors), first and second banks of I/O ports arranged along one or more sides of the die, and a multiplexing circuit. The multiplexing circuit can be changed from a first state to a second state. In the first state the first bank of I/O ports is coupled to the semiconductor device(s) and the second bank of I/O ports is not coupled to the semiconductor device(s), and in the second state the first bank of I/O ports is not coupled to the semiconductor device(s) and the second bank of I/O ports is coupled to the semiconductor device(s). The state of the multiplexing circuit can be set, for example, by an on-die fuse circuit or an externally accessible select line. The semiconductor die can be included in a chip package, which can then be included on a printed circuit board. The same chip package can be configured to interface with a different number of I/O channels, for multi-channel operation.

General Overview

As noted above, there are a number of unresolved issues that complicate the sourcing of memory devices. In more detail, memory product packaging configurations can be vary by both die count (e.g., SDPs, DDPs, QDPs, etc.), and by I/O channel count (e.g., packages that incorporate 1, 2, or more I/O ports). These variations in packaging are necessary to efficiently support the wide diversity of end product configurations (such as high performance data center products, maximum capacity data center products, and space constrained client products, to name a few examples) that memory devices are used in. One challenge this variety of package types imposes on a memory vendor is the need to forecast, manufacture, and inventory a wide diversity of stock keeping units (SKUs), and that once packaged much of the inventory the company must carry is quite end product specific. To this end, the packaging techniques provided herein effectively create smarter memory packages that are configurable and thus can be used in a diversity of system applications, thus providing fungibility to the supply chain inventory. This allows a memory vendor to streamline their forecasting, manufacturing and inventory operations without sacrificing the ability to service a wide spectrum of target system uses.

According to an embodiment of the present disclosure, a dynamically configurable multi-chip package design is disclosed. The package design allows for the same manufactured and packaged set of dies to be configured to operate for any number of channels. Beneficially, this configuration can be carried out at any time in the supply chain, such as during or upon completion of fabrication, or by a memory vendor or installer, or by an end-product seller or user, according to some embodiments. According to some such embodiments, the specific channel configuration is set using a multiplexing circuit to select a particular set of I/O ports to use for each die in the multi-chip package. The select bit of the multiplexer may be set, for example, using a fuse circuit to permanently select the particular set of I/O ports during the manufacturing process of the multi-chip package. Note that, in some such cases, the channel configuration can be pre-fused prior to packaging in case there will be no opportunity to do so in-system or elsewhere downstream. In other embodiments, the select bit of the multiplexer may be bonded out to a package pin (or otherwise made accessible). In such cases, an external signal or circuit can be used to drive that pin to dynamically select the particular set of I/O ports, post-manufacturing of the multi-chip package.

According to some embodiments, each die in the multi-chip package has different sets of I/O ports coupled to corresponding sets of I/O ports of each of the other dies in the multi-chip package. This allows for multiple possible configurations where different sets of I/O ports of different dies may be activated to accommodate any number of communication channels with a memory controller.

As noted above, the dynamic or otherwise flexible selection of the I/O ports on each die of the multi-chip package allows for memory vendors to streamline their forecasting, manufacturing, and inventory operations without sacrificing the ability to service a wide range of end products. By only needing to manufacture one stacked multi-chip design that can be configured for use with any number of I/O channels, manufacturing costs are dramatically reduced while still producing memory devices that can be adaptable to work with various memory module configurations (e.g., different number of channels interfacing with each memory device). It should be understood that although some embodiments discussed herein are focused on using a dynamically configurable multi-chip package design for memory applications, this is not required and that the multi-chip design may be used for any type of packaged semiconductor devices, such as logic circuits, processors, or some other circuitry having configurable channels or other features that can be selectively configured using the techniques provided herein.

In one embodiment, a semiconductor die includes one or more semiconductor devices, a first bank of I/O ports arranged along one of the sides of the die, a second bank of I/O ports arranged along one of the sides of the die, and a multiplexing circuit coupled between the first bank of I/O ports, second bank of I/O ports, and the one or more semiconductor devices. The first and second I/O ports may be on the same side of the die, or different sides of the die. In some embodiments, the first and second I/O ports are on opposite sides of the die. In any such cases, the semiconductor die further includes a fuse circuit coupled to the multiplexing circuit, according to some embodiments. The fuse circuit is designed to change a state of the multiplexing circuit between a first state where the first bank of I/O ports is coupled to the one or more semiconductor devices and the second bank of I/O ports is not coupled to the one or more semiconductor devices, and a second state where the first bank of I/O ports is not coupled to the one or more semiconductor devices and the second bank of I/O ports is coupled to the one or more semiconductor devices.

In another embodiment, a chip package includes a plurality of semiconductor dies stacked on one another. Each of the semiconductor dies includes one or more semiconductor devices, a first bank or plurality of I/O ports arranged along one of the sides of the die, a second bank or plurality of I/O ports arranged along one of the sides of the die, a multiplexing circuit coupled between the first plurality of I/O ports, second plurality of I/O ports, and the one or more semiconductor devices, and a fuse circuit coupled to the multiplexing circuit. The fuse circuit is designed to change a state of the multiplexing circuit between a first state where the first plurality of I/O ports are coupled to the one or more semiconductor devices and the second plurality of I/O ports are not coupled to the one or more semiconductor devices, and a second state where the first plurality of I/O ports are not coupled to the one or more semiconductor devices and the second plurality of I/O ports are coupled to the one or more semiconductor devices. The first plurality of I/O ports of each of the dies of the plurality of semiconductor dies are coupled together and the second plurality of I/O ports of each of the dies of the plurality of semiconductor dies are coupled together. In some embodiments, each of the semiconductor dies includes additional pluralities of I/O ports arranged along one of the sides of each die to accommodate a greater number of simultaneous channels. In some cases, corresponding pluralities of I/O ports of the dies are coupled together.

Numerous variations and embodiments will be appreciated in light of this disclosure. Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y.

Example Memory System

FIG. 1 illustrates a memory module 100 in communication with a memory controller 102 and a CPU 104, according to some embodiments. Memory module 100 includes a plurality of memory devices 106 coupled to one surface (or to both front and back surfaces) of memory module 100. In some embodiments, memory module 100 is a standard printed circuit board (PCB) that includes any number of laminated dielectric layers. In a more general sense, memory module 100 can be any platform suitable for carrying the one or more memory devices 106.

Each of memory devices 106 includes a multi-chip stack of die, where each die of the stack includes an addressable array of memory cells, according to an embodiment. As will be explained in turn with respect to FIGS. 2A-B, each die of device 106 can be dynamically configured. A plurality of edge conductors 108 along one side of memory module 100 are used to electrically couple memory module 100 with a motherboard (not shown) or system chassis such that signals may be transmitted to and from the various memory devices 106 on memory module 100. Any number of memory modules 100 may be coupled to the motherboard or chassis via their corresponding edge conductors 108.

Memory controller 102 receives commands from CPU 104 regarding data to be written to particular memory cells or data to be read from particular memory cells. Memory controller 102 then issues the corresponding memory control signals to activate the correct memory device(s) 106 and die(s) within the selected memory device(s) 106 in order to read/write the data from/to the corresponding memory cells. As will be appreciated, CPU 104 may be any standard or proprietary processing entity and its design and operation is not limiting to any of the embodiments discussed herein. Likewise, memory controller 102 may be any standard or proprietary memory controller and its design and operation is not limiting to any of the embodiments discussed herein.

Memory controller 102 accesses a given memory device 106 with any number of communication channels depending on the configuration of memory controller 102 and memory module 100. For example, a single channel may be used for each memory device 106 where a chip select signal is also provided by memory controller 102 to activate only one of the dies in the multi-chip stack of the given memory device 106. Dual channels may be used for each memory device 106, and chip select signals are used in cases where more than 2 dies are present within each memory device 106. Similarly, quad channels may be used for each memory device 106, and chip select signals are used in cases where more than 4 dies are present within each memory device 106. By dynamically configuring each memory device 106, post-fabrication, to work with any number of channels, the same chip package can be fabricated and used for any desired channel configuration.

Multi-Chip Design

Figure 2A:
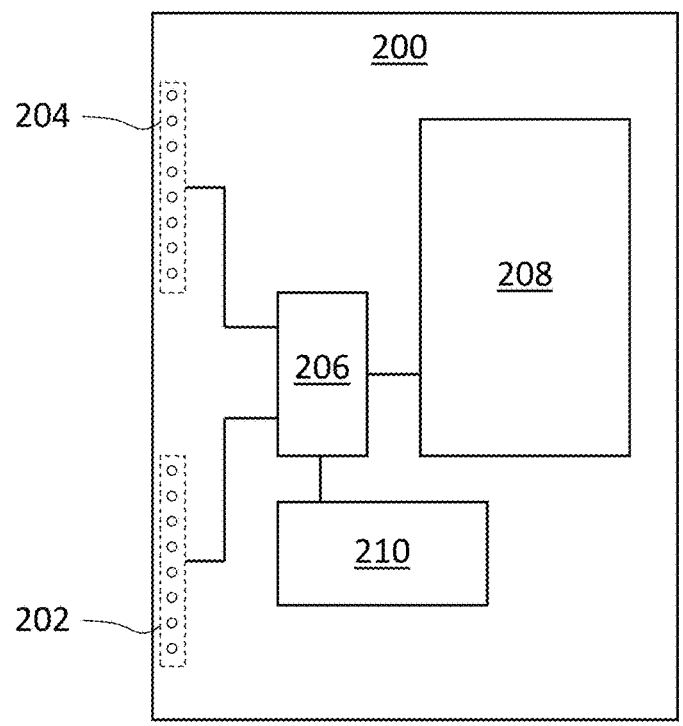
FIG. 2A illustrates a top-down view of a dynamically configurable semiconductor die, configured in accordance with some embodiments of the present disclosure.

FIG. 2A illustrates a top-down view of a single die 200 that would be used in a multi-chip stack, according to an embodiment. In some embodiments, each other die of the multi-chip stack would have the same design as single die 200. As will be appreciated, memory devices 106 of FIG. 1 each include a stack of die 200, according to an embodiment. In the illustrated example, single die 200 would be used in a multi-chip stack having 2 stacked die. According to some embodiments, die 200 includes two sets of I/O ports, a first plurality or bank of I/O ports 202 and a second plurality or bank of I/O ports 204. The number of sets of I/O ports on each die of a multi-chip stack dictate the total number of possible channels that can be used with the multi-chip stack. For this illustrated example, two sets of I/O ports 202 and 204 allow for either single channel or dual-channel operation. Each set of I/O ports 202 and 204 may include any number of ports (e.g., 4 ports, 8 ports, 16 ports, etc).

According to some embodiments, each set of I/O ports 202 and 204 is coupled to a multiplexing circuit 206. Multiplexing circuit 206 includes any number of digital multiplexers to select which set of I/O ports 202 or 204 is coupled to one or more semiconductor devices 208. According to some embodiments, one or more semiconductor devices 208 includes an addressable memory array (e.g., in row/column format) of memory cells. The memory can be any type of memory, for example, any type of dynamic random-access memory (DRAM), FLASH memory, magnetoresistive memory, or 3D)(Point memory. Multiplexing circuit 206 can be in either a first state where first set of I/O ports 202 are coupled to one or more semiconductor devices 208 and second set of I/O ports 204 are not coupled to one or more semiconductor devices 208, or a second state where second set of I/O ports 204 are coupled to one or more semiconductor devices 208 and first set of I/O ports 202 are not coupled to one or more semiconductor devices 208. Note that additional sets of I/O ports would correspondingly allow for multiplexing circuit 206 to be set to any number of other states equal to the total number of sets of I/O ports. The manner in which multiplexing circuit 206 is set can vary from one embodiment to the next. In some cases, fusing is used to set multiplexing circuit 206, while in other cases an external signal delivered via a wirebond or other similar I/O scheme is used to set multiplexing circuit 206.

In cases where selection is made via driving a configuration pin with an external signal (as will be discussed in turn, with reference to FIG. 6), then there would be no need for on-die fusing. Note that setting multiplexing circuit 206 by driving an external pin can be accomplished post-packaging and dynamically. In cases where fusing is used, note that fusing can be carried out in a number of ways, such as with permanent fusing technology and reversible fusing technology. According to one such example embodiment, the state of multiplexing circuit 206 is set using one or more electronic fuses within a fuse circuit 210. Fuse circuit 210 can include programmable fuses, such as transistors that can permanently or reversibly have the state of their active semiconducting region altered by an appropriate programming signal. For example, a high-k/metal gate logic transistor can be stressed in strong inversion to induce a positive bias temperature instability (BTI) or traps in the high-k gate oxide. The traps create an increase in the threshold voltage ($V_t$) of the transistor. For gate voltages below $V_t$, the transistor is comparable to a digital switch in the off position, and for gate voltages above $V_t$, the transistor is comparable to a digital switch in the on position. In a more general sense, any fusing technology suitable for selecting a multiplexor configuration can be used. In any such cases, the fuses of fuse circuit 210 may be set, for example, during the manufacturing phase of die 200 before it has been packaged within a particular multi-chip package, or post-packaging should the on-chip fusing circuit be made accessible via the package configuration according to some embodiments. Once set, the fuses permanently (or reversibly, as the case may be) set the logic level ('1' or '0') of one or more select lines leading to the one or more multiplexers within multiplexer circuit 206, according to some embodiments. A permanent selection can be used, for example, to ensure that the I/O selection of die 200 is not accidently changed during operation, which may lead to data corruption. On the other hand, a reversible selection allows the setting of multiplexing circuit 206 can be changed multiple times, which may be desirable in some applications.

Figure 2B:
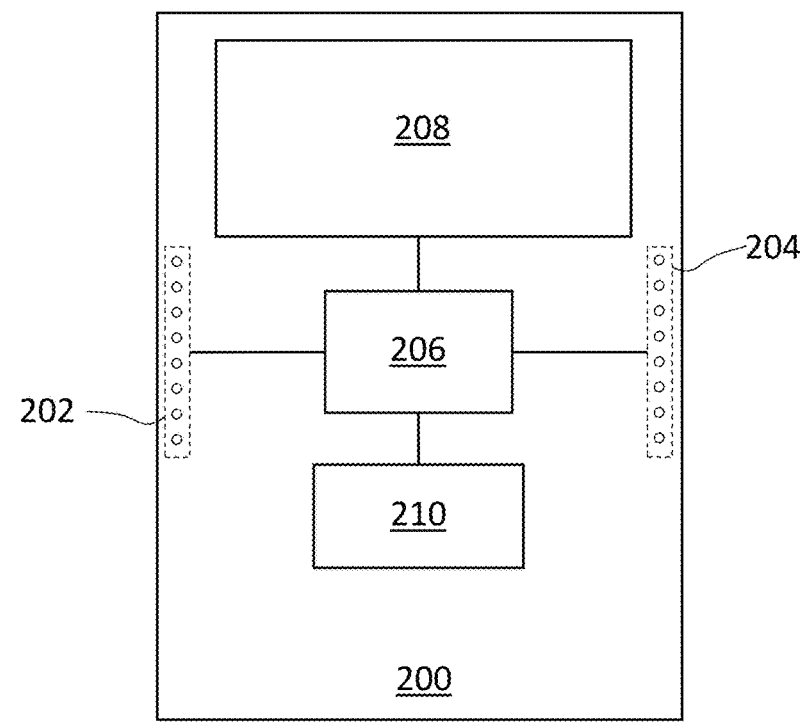
FIG. 2B illustrates a top-down view of another dynamically configurable semiconductor die, configured in accordance with some embodiments of the present disclosure.

According to some embodiments, first set of I/O ports 202 and second set of I/O ports 204 may be arranged along any side of die 200. In FIG. 2A, each of first set of I/O ports 202 and second set of I/O ports 204 are arranged along the same side of die 200. In another embodiment, FIG. 2B illustrates that first set of I/O ports 202 is arranged along one side of die 200 while second set of I/O ports 204 is arranged along the opposite side of die 200. Any number of sets of I/O ports can be arranged along any side of die 200 depending on the total number of desired channels to use with the given multi-chip stack.

It should be noted that the relative arrangement and size of each of multiplexer circuit 206, fuse circuit 210 (if present, or other selection circuitry), and one or more semiconductor devices 208 is provided for illustration purposes only and is not representative of any specific implementation. However, as will be appreciated in light of this disclosure, the arrangement of I/O ports along a same side of die 200 as illustrated in FIG. 2A is more conducive to arranging multiple dies in a stair-step configuration as illustrated in FIGS. 3A and 3B; likewise, the arrangement of I/O ports along different sides of die 200 as illustrated in FIG. 2B is more conducive to arranging multiple dies in a vertical stack configuration as illustrated in FIGS. 4A and 4B.

Figure 3A:
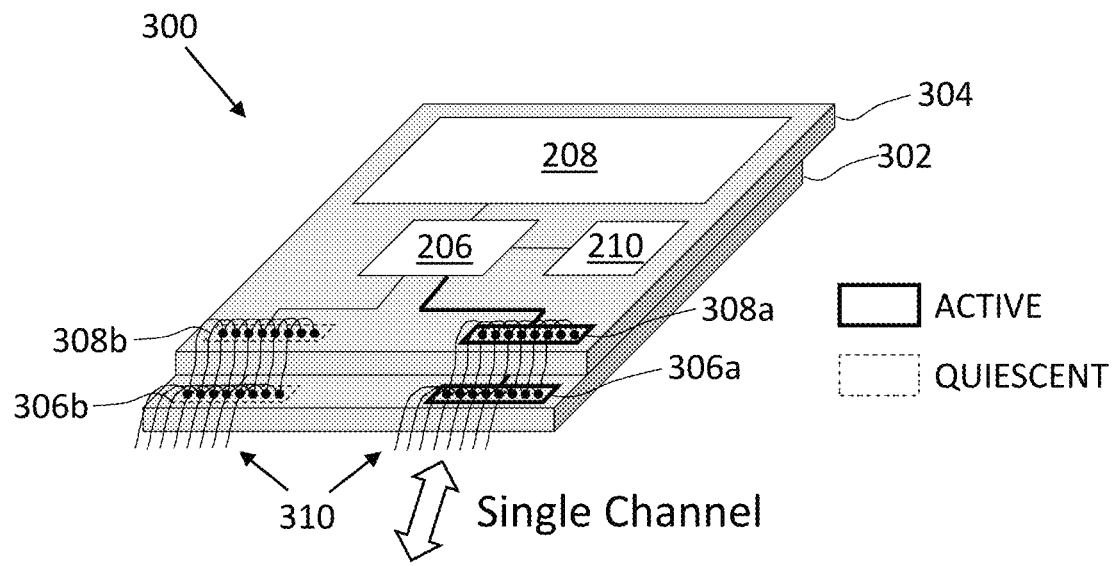
FIG. 3A illustrates a perspective view of a stack of two dies configured for a single channel operation, in accordance with an embodiment of the present disclosure.
Figure 3B:
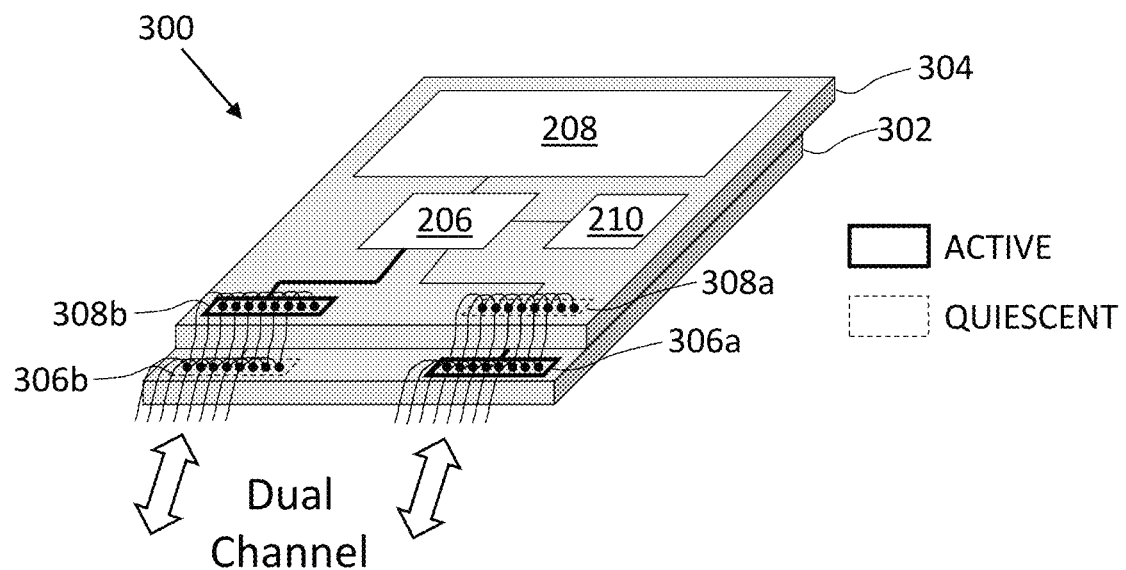
FIG. 3B illustrates a perspective view of the stack of two dies from FIG. 3A configured for a dual channel operation, in accordance with an embodiment of the present disclosure.
Figure 4A:
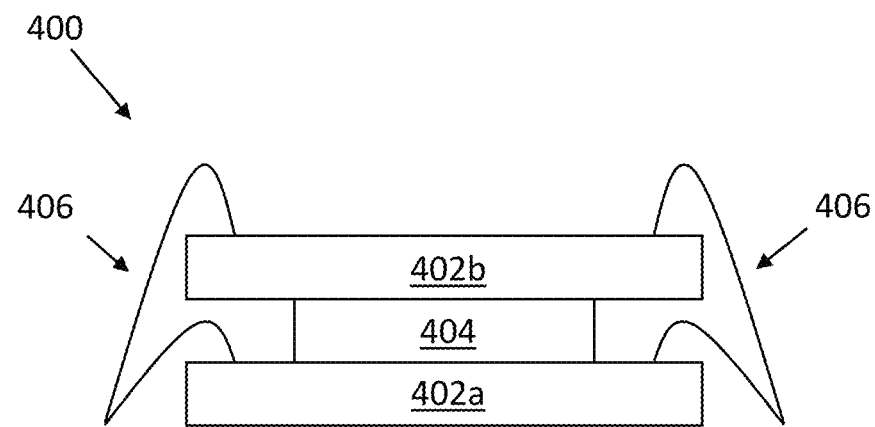
FIG. 4A illustrates a side view of a stack of dies having a spacer between adjacent dies, in accordance with an embodiment of the present disclosure.
Figure 4B:
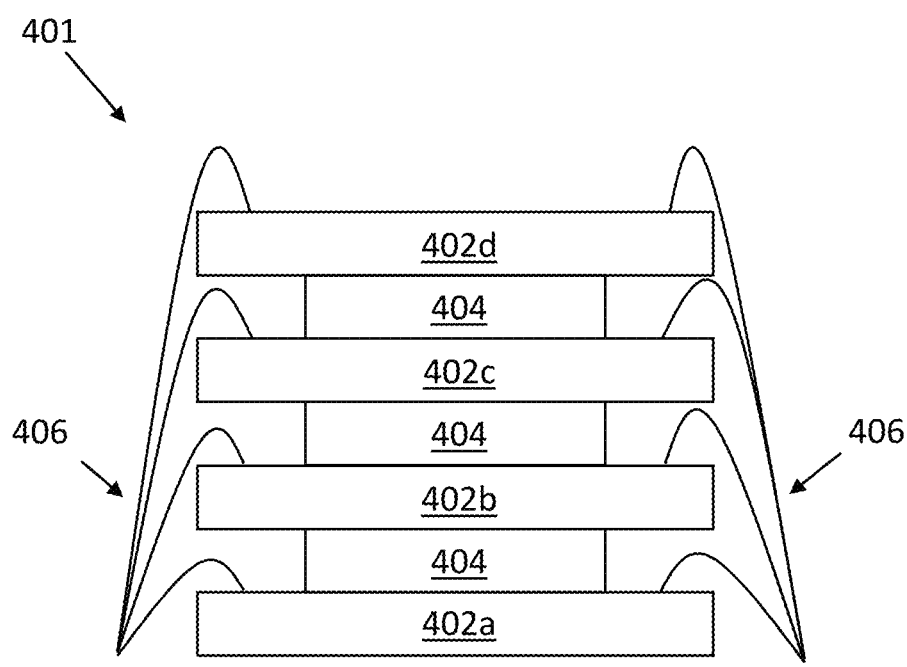
FIG. 4B illustrates a side view of a larger stack of dies having a spacer between adjacent dies, in accordance with an embodiment of the present disclosure.

FIGS. 3A and 3B each illustrates a multi-chip stack 300 having a stair-step configuration with a first die 302 located under a second die 304, according to some embodiments. First die 302 includes a first set of I/O ports 306a and a second set of I/O ports 306b while second die 304 includes a first set of I/O ports 308a and a second set of I/O ports 308b. Wirebonds 310 are used to couple first set of I/O ports 306a of first chip 302 with first set of I/O ports 308a of second chip 304, and are similarly used to couple second set of I/O ports 306b of first chip 302 with second set of I/O ports 308b of second chip 304. By coupling all corresponding sets of ports of each die together, multi-chip stack 300 can be used in either a single channel or dual channel configuration, as described in more detail herein.

FIG. 3A illustrates multi-chip stack 300 configured for a single channel operation. Multiplexer circuit 206 of each of first die 302 and second die 304 is set in a state to couple first set of I/O ports 306a of first die 302 and first set of I/O ports 308a of second die 304 to the corresponding one or more semiconductor devices 208 on each die. Since both dies are coupled out from the same set of I/O ports, a single channel is used to interface with each chip. A chip select signal would be used by the memory controller (shown in FIG. 1) to select which of die 302 or die 304 is to be accessed for any given read/write/erase command. The mux-based selection of first set of I/O ports 306a of first die 302 and first set of I/O ports 308a of second die 304 is illustrated using bolded solid lines, while the other I/O ports are not selected as illustrated using dashed lines. In some embodiments, unselected I/O ports are quiesced to save power and/or to reduce electromagnetic interference.

In some fuse-based embodiments, the selection of the same set of coupled ports between dies (e.g., single channel operation) is a default setting that does not require any changes to be made to fuse circuit 210. That is, upon fabrication of die 302 and die 304, multiplexer circuit 206 of each die begins in a state that correspondingly selects first set of I/O ports 306a of first die 302 and first set of I/O ports 308a of second die 304. In this way, the fuses of fuse circuit 210 (or other default selection circuitry) need only be activated or otherwise modified to change the state of multiplexer circuit 206 to select another set of I/O ports.

FIG. 3B illustrates multi-chip stack 300 configured for a dual channel operation, according to an embodiment. Multiplexer circuit 206 of first die 302 is set in a first state to couple first set of I/O ports 306a of first die 302 to the corresponding one or more semiconductor devices 208 of first die 302. Multiplexer circuit 206 of second die 304 has been set in a second state to couple second set of I/O ports 308b of second die 304 to the corresponding one or more semiconductor devices 208 of second die 304. As can be further seen in this example embodiment, the state of multiplexer circuit 206 of second die 304 is switched using fuse circuit 210 before multi-chip stack 300 is fully packaged. By switching the state of one of the multiplexer circuits, a first channel may be used to interact with first set of I/O ports 306a of first die 302 while a second channel can simultaneously interact with second set of I/O ports 308b of second die 304. Put another away, one channel can interact with the semiconductor devices (e.g., memory cells) of first die 302 while another channel can simultaneously interact with the one or more semiconductor devices 208 (e.g., memory cells) of second die 304. Any number of dies within multi-chip stack 300 can have the state of its multiplexer circuit 206 changed. In some other embodiments, the state of multiplexer circuit 206 of first die 302 is switched using fuse circuit 210 before multi-chip stack 300 is fully packaged. In still other embodiments, both multiplexer circuits 206 of the first die 302 and second die 304 are switched using fuse circuit 210 before multi-chip stack 300 is fully packaged. In some other embodiments, one or both of multiplexer circuits 206 are programmed after packaging multi-chip stack 300 and after assembling the packaged chips onto a memory sub-system.

Although corresponding sets of I/O ports between first die 302 and second die 304 are still coupled together, multiplexing circuit 206 ensures that only one set of I/O ports per die is coupled to the corresponding one or more semiconductor devices 208. Although only two dies are illustrated, any number of dies may be stacked in multi-chip stack 300, each with any number of sets of I/O ports. Typically, the number of dies in the die stack is an integer multiple of the number of sets of I/O ports provided per die.

Figure 3C:
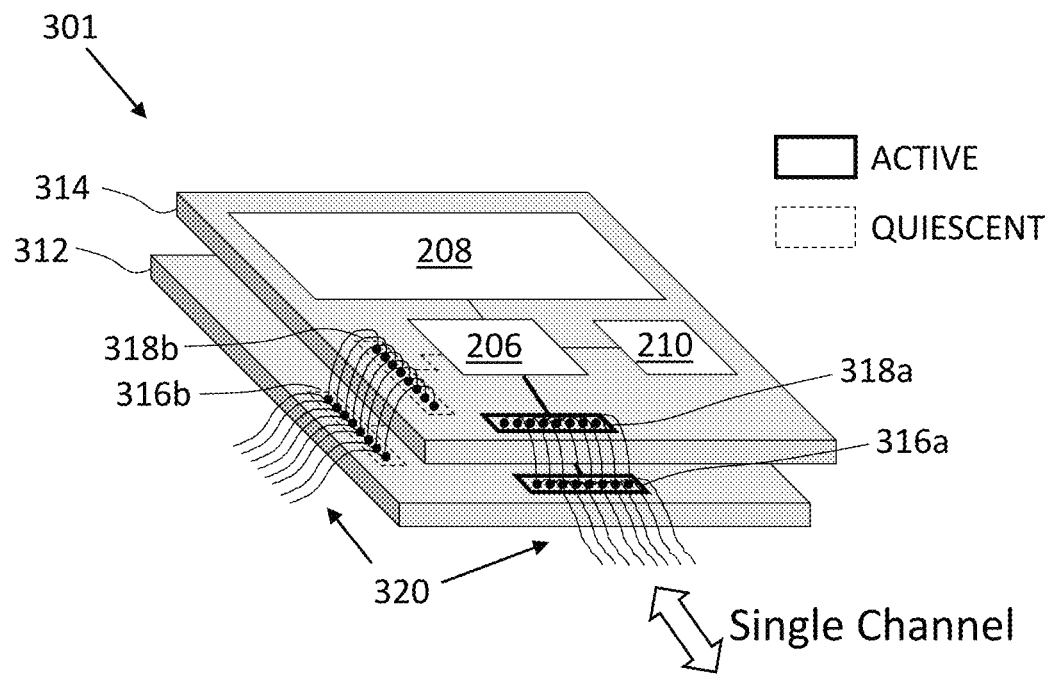
FIG. 3C illustrates a perspective view of another stack of two dies configured for a single channel operation, in accordance with an embodiment of the present disclosure.
Figure 3D:
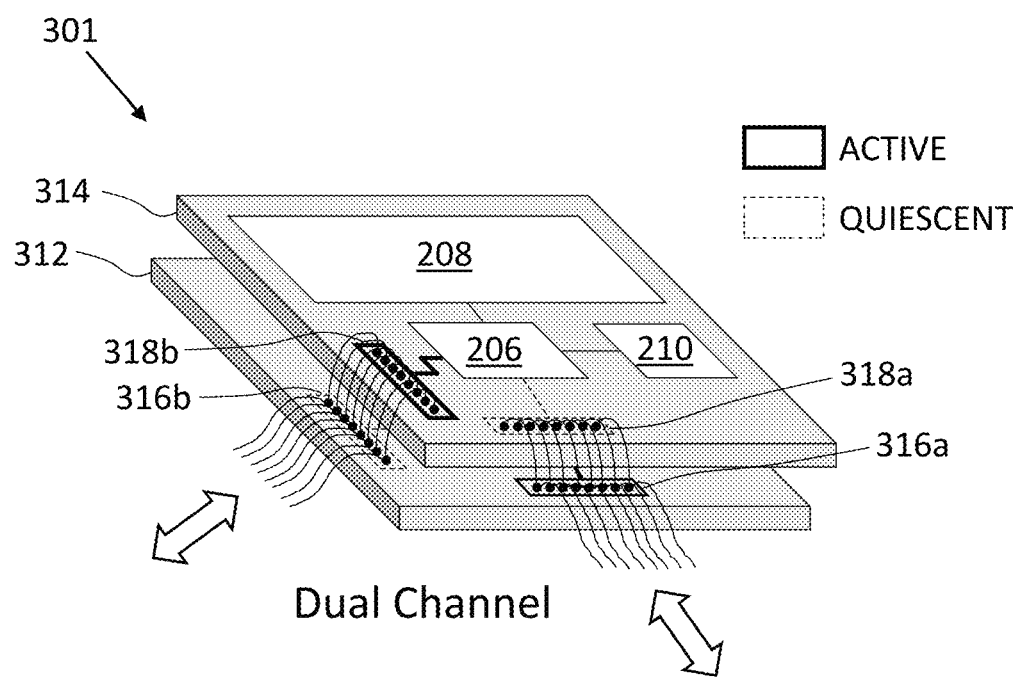
FIG. 3D illustrates a perspective view of the stack of two dies from FIG. 3C configured for a dual channel operation, in accordance with an embodiment of the present disclosure.

FIGS. 3C and 3D each illustrates another multi-chip stack 301 having a diagonal stair-step configuration with a first die 312 located under a second die 314, according to some embodiments. First die 312 includes a first set of I/O ports 316a and a second set of I/O ports 316b while second die 314 includes a first set of I/O ports 318a and a second set of I/O ports 318b. Wirebonds 320 are used to couple first set of I/O ports 316a of first chip 312 with first set of I/O ports 318a of second chip 314, and are similarly used to couple second set of I/O ports 316b of first chip 312 with second set of I/O ports 318b of second chip 314. In the diagonal stair-step configuration, the different sets of I/O ports on a given die are located on adjacent sides of the die. The operation of switching between active sets of I/O ports proceeds in the same manner as discussed above for FIGS. 3A and 3B.

FIG. 4A illustrates another multi-chip stack 400 arranged in a vertical stack where the dies are arranged directly over each other, according to an embodiment. Specifically, a first die 402a and a second die 402b are arranged in a vertical stack arrangement with a spacer 404 sandwiched between them. Spacer 404 may be placed between each adjacent die within multi-chip stack 400 for however many dies are present in the stack. According to some embodiments, spacer 404 provides enough Z-spacing between dies to access the I/O ports on the edge of each die using, for example, wirebonds 406. Spacer 404 may have a thickness between about 500 micrometers (μm) and 1500 μm, according to some embodiments. Spacer 404 can be any electrically insulative material, such as any dielectric material.

According to some embodiments, wirebonds 406 connect corresponding sets of I/O ports along different sides of each of first die 402a and second die 402b. The wirebonds may terminate at the same point or on the same conductive pad on an interposer (not shown) to electrically couple the corresponding sets of I/O ports of each die.

FIG. 4B illustrates another multi-chip stack 401 having more dies 402a-402d arranged in a vertical stack with spacers 404 arranged between adjacent dies in the stack, according to an embodiment. Like in multi-chip stack 400, wirebonds 406 are used to connect corresponding sets of I/O ports along different sides of each of dies 402a-402d. Since the sets of I/O ports may be arranged along any side of the dies, there is no limitation to where the wirebonds are placed. According to some embodiments, factors that limit the total number of dies used in the vertical stack include heat generation and end-device limitations with regards to the total Z-height.

Figure 5A:
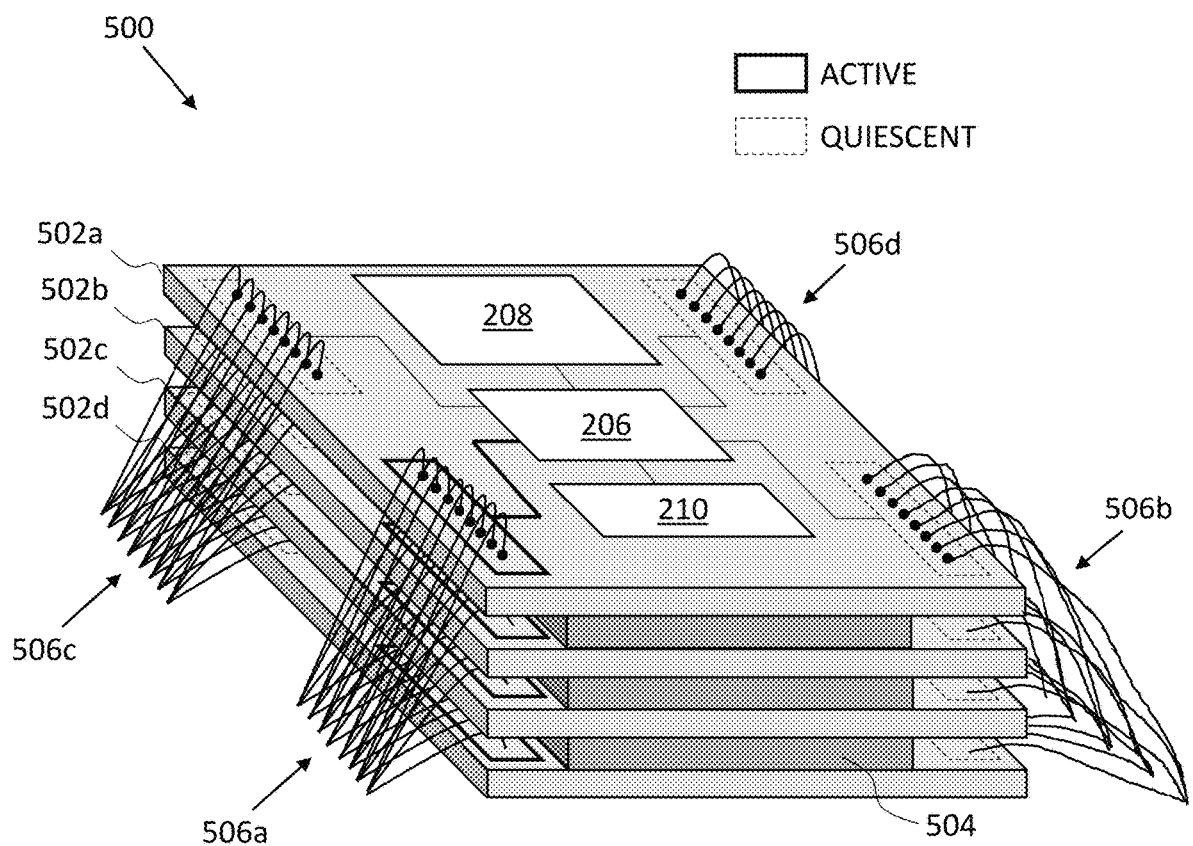
FIG. 5A illustrates a perspective view of a stack of four dies configured for a single channel operation, in accordance with an embodiment of the present disclosure.
Figure 5B:
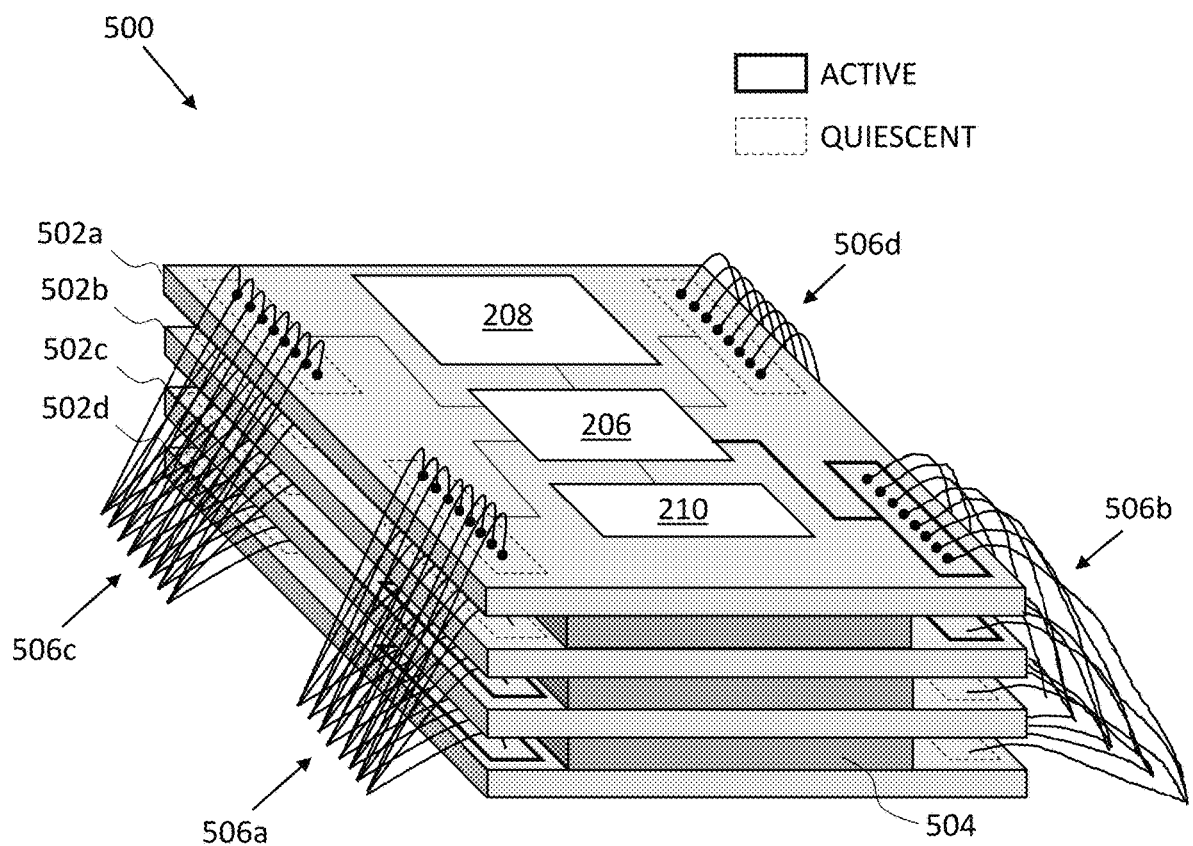
FIG. 5B illustrates a perspective view of the stack of four dies from FIG. 5A configured for a dual channel operation, in accordance with an embodiment of the present disclosure.
Figure 5C:
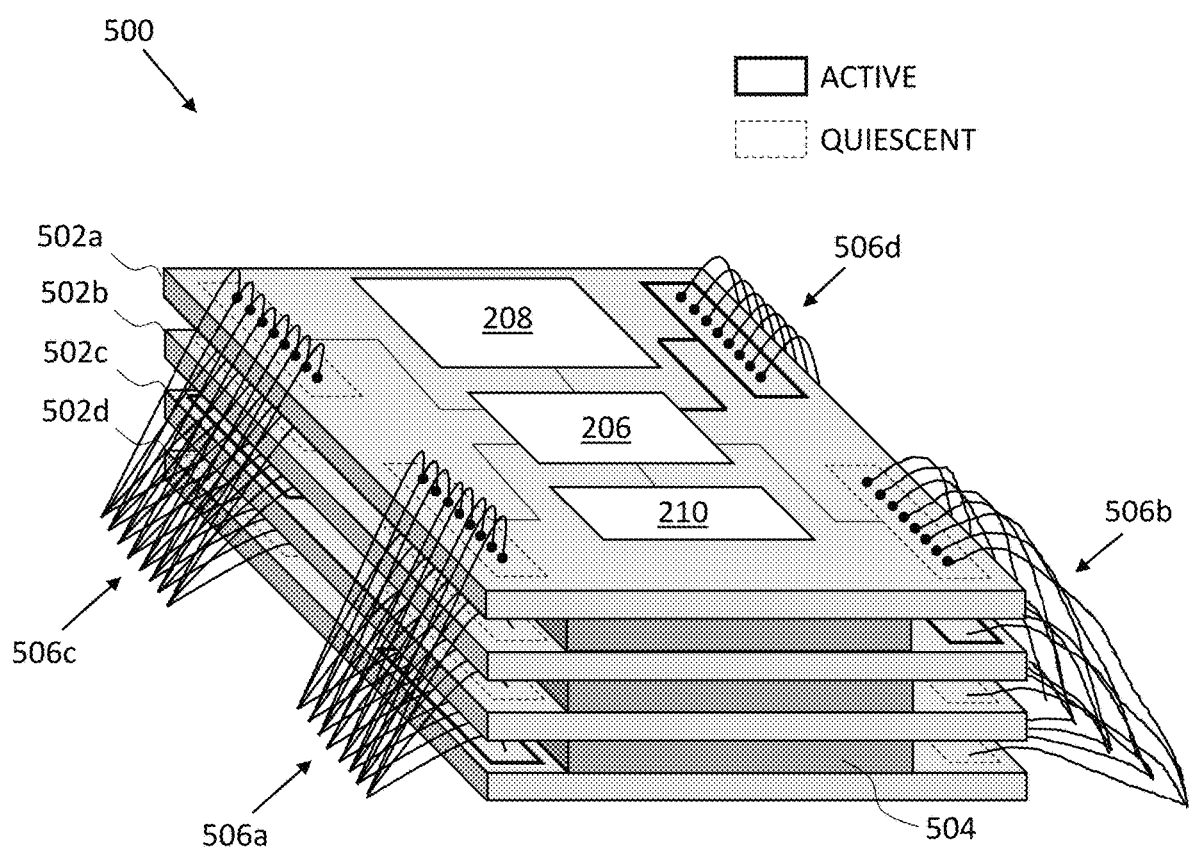
FIG. 5C illustrates a perspective view of the stack of four dies from FIG. 5A configured for a quad channel operation, in accordance with an embodiment of the present disclosure.

FIGS. 5A-5C illustrate a multi-chip stack 500 arranged in a vertical stack of four dies, 502a-502d, with spacers 504 between adjacent dies, according to some embodiments. Each die of multi-chip stack 500 includes four sets of I/O ports arranged around two of the sides of each die. Other arrangements are possible for the sets of I/O ports as they can each be arranged along any side of a die. Like the multi-chip stack 300 of FIGS. 3A and 3B, each die 502a-502d includes multiplexing circuit 206 to select a particular set of I/O ports, fuse circuit 210 (or other selection circuitry) coupled to multiplexing circuit 206, and one or more semiconductor devices 208 coupled to multiplexing circuit 206. Each of the first sets of I/O ports of dies 502a-502d are coupled together as a first bundled set of I/O ports 506a. Each of the second sets of I/O ports of dies 502a-502d are coupled together as a second bundled set of I/O ports 506b. Each of the third sets of I/O ports of dies 502a-502d are coupled together as a third bundled set of I/O ports 506c. Each of the fourth sets of I/O ports of dies 502a-502d are coupled together as a fourth bundled set of I/O ports 506d.

FIG. 5A illustrates multi-chip stack 500 configured for a single channel operation, according to an embodiment. Multiplexer circuit 206 of each of dies 502a-502d is set in a state to couple the first set of I/O ports of each die to the corresponding one or more semiconductor devices 208 on each die (as illustrated using solid bold lines around the I/O ports of each die). Since all four dies 502a-502d are coupled out from the same first bundled set of I/O ports 506a, a single channel is used to interface with each die in the stack. A chip select signal would be used by the memory controller to select which of dies 502a-502d is to be accessed for any given read/write/erase command. Note that in the single channel operation, all other sets of I/O ports not part of first bundled set of I/O ports 506a are unused even though they are all still coupled out using wirebonds (or any other chip coupling technique).

In some embodiments, multiplexer circuit 206 may have a default state being the selection of the first set of I/O ports within first bundled set of I/O ports 506a. Accordingly, activation of fuse circuit 210 (or other selection circuitry) may not be needed to configure multi-chip stack 500 for single channel operation. In some other embodiments, fuse circuit 210 is used to change the state of multiplexer circuit 206 to select the first set of I/O ports of each die. In still other embodiments, an external signal can be applied a bonded out pin to change the state of multiplexer circuit 206 to select the first set of I/O ports of each die (as will be discussed with respect to FIG. 6).

FIG. 5B illustrates multi-chip stack 500 configured for a dual channel operation, according to an embodiment. Multiplexer circuit 206 of each of first die 502a and second die 502b is set in a state to couple the second set of I/O ports of first die 502a and second die 502b to the corresponding one or more semiconductor devices 208 on each die (as illustrated using solid bold lines around the second I/O ports of first die 502a and second die 502b). Multiplexer circuit 206 of each of third die 502c and fourth die 502d is set in a state to couple the first set of I/O ports of third die 502c and fourth die 502d to the corresponding one or more semiconductor devices 208 on each die. In this way, two of the four total dies have their devices coupled out through second bundled set of I/O ports 506b while the other two of the four total dies have their devices coupled out through first bundled set of I/O ports 506a, thus allowing for dual channel operation. In general, for dual channel operation, half of the total number of dies present in multi-chip stack 500 are coupled to one channel while the other half are coupled to the other channel. A chip select signal would be used by the memory controller on each channel to select which of die 502c or die 502d of the first channel, and which of die 502a or die 502b of the second channel, is to be accessed for any given read/write/erase command. Note that any of the sets of I/O ports of each die could be selected by multiplexing circuit 206 of each die so long as two of the dies have their selected I/O ports coupled together and the other two of the dies have their selected I/O ports coupled together.

As discussed above, the state of multiplexer circuit 206 may be set using fuse circuit 210 for each die. In some embodiments, multiplexer circuit 206 may have a default state being the selection of the first set of I/O ports within first bundled set of I/O ports 506a. In such cases, only fuse circuits 210 of first die 502a and second die 502b are used to change the state of multiplexer circuit 206 of first die 502a and second die 502b. In still other embodiments, an external signal can be applied a bonded out pin to change the state of multiplexer circuit 206 to select the first set of I/O ports of each die (as will be discussed with respect to FIG. 6).

FIG. 5C illustrates multi-chip stack 500 configured for a quad channel operation, according to an embodiment. Multiplexer circuit 206 of first die 502a is set in a state to couple the fourth set of I/O ports of first die 502a to the corresponding one or more semiconductor devices 208 of first die 502a. Multiplexer circuit 206 of second die 502b is set in a state to couple the second set of I/O ports of second die 502b to the corresponding one or more semiconductor devices 208 of second die 502b. Multiplexer circuit 206 of third die 502c is set in a state to couple the third set of I/O ports of third die 502c to the corresponding one or more semiconductor devices 208 of third die 502c. Multiplexer circuit 206 of fourth die 502d is set in a state to couple the first set of I/O ports of fourth die 502d to the corresponding one or more semiconductor devices 208 of fourth die 502a. In this way, die 502a has its devices coupled out through fourth bundled set of I/O ports 506d, die 502b has its devices coupled out through second bundled set of I/O ports 506b, die 502c has its devices coupled out through third bundled set of I/O ports 506c, and die 502d has its devices coupled out through first bundled set of I/O ports 506a, thus allowing for quad channel operation. In general, for quad channel operation, a quarter of the total number of dies present in multi-chip stack 500 are coupled to each channel. With only four chips in the stack, a chip select signal is not required as each of the four channels only interfaces with a single chip in the stack.

For each channel configuration (single, dual, or quad) illustrated in FIGS. 5A-5C, the same multi-chip stack 500 is used. Accordingly, the same fabricated chip stack design can be used for various channel configurations. This is an advantage over current fabrication methods which would require a different chip stack with a different wirebonding scheme to be used for each channel configuration. The use of four dies and up to four channels is for illustrative purposes only—any number of dies and channels could be interfaced with a same fabricated multi-chip stack using the techniques discussed herein. Also, it should be noted that asymmetric configurations are also possible where, for example, three of the four dies are coupled to one channel while the fourth die is coupled to a different channel. Any number of multi-chip package configurations can be used, as will be appreciated in light of this disclosure.

Figure 6:
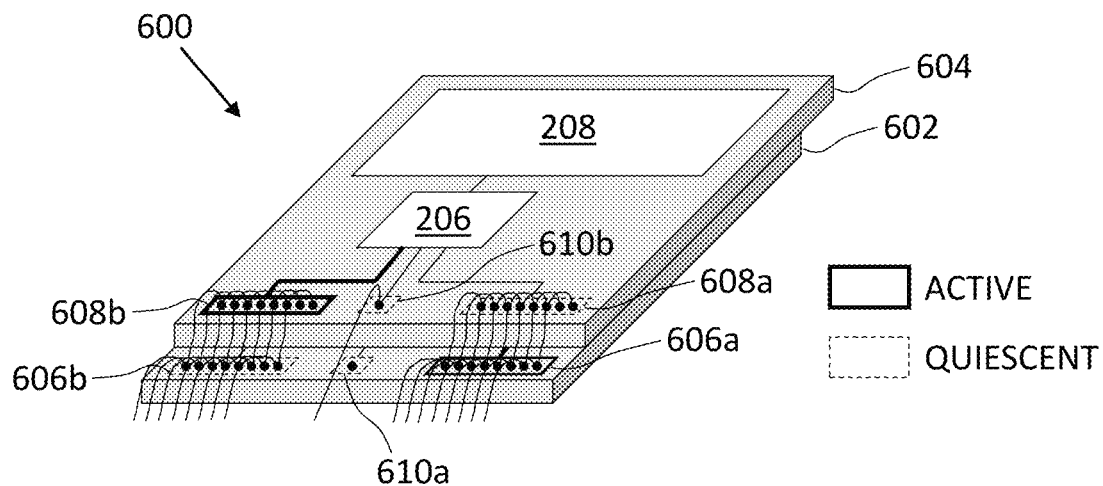
FIG. 6 illustrates a perspective view of a stack of two dies having a dedicated select pin for the multiplexer, in accordance with an embodiment of the present disclosure.

Fusible links that are not reversible allow for a permanent selection of I/O ports to use for a given die, and fusible links that are reversible allow for changing the selection of I/O ports to use for a given die. In either such cases, fusible links can be used during the packaging process of the die, or even post-packaging if proper access to the fusible links is provided. However, in some embodiments that don't include fusible links, the selection may be made using a separate electric signal that can be provided to the die after packaging has been completed. FIG. 6 illustrates one such embodiment, which includes multi-chip stack 600 with a first die 602 and a second die 604. Like multi-chip stack 300, first die 602 has a first set of I/O ports 606a and a second set of I/O ports 606b, and second die 604 has a first set of I/O ports 608a and a second set of I/O ports 608b. Multiplexing circuit 206 of each die may be set in a default state to select first set of I/O ports 606a and 608a. According to an embodiment, each of first die 602 and second die 604 includes a select line 610a and 610b, respectively, provided to the corresponding multiplexing circuit 206 of each die. Select lines 610a and 610b may each include its own wirebond or other chip interface structure and may receive a signal from off-chip to change the state of the corresponding multiplexing circuit 206. In the illustrated example, a wirebond is provided on select line 610b to change the state of multiplexing circuit 206 from a first state to a second state where second set of I/O ports 608b are coupled to the corresponding one or more semiconductor devices 208 of second die 604. In this way, select line 610a or 610b may be used to configure multi-chip stack 600 for a single channel or a dual channel operation.

In some embodiments, only half of the total number of dies within the multi-chip stack have their corresponding select lines coupled to wirebonds or other interface structures to receive a signal from off-chip. Only half of the dies may need to have their active I/O ports changed to change between a single channel and a dual channel arrangement. If more dies are present in the stack, more wirebonds may be used to couple to the additional select lines to configure the dies for multi-channel operation. In general, the number of active select lines used is one less than the maximum number of possible channels interfacing with the multi-chip stack.

Figure 7:
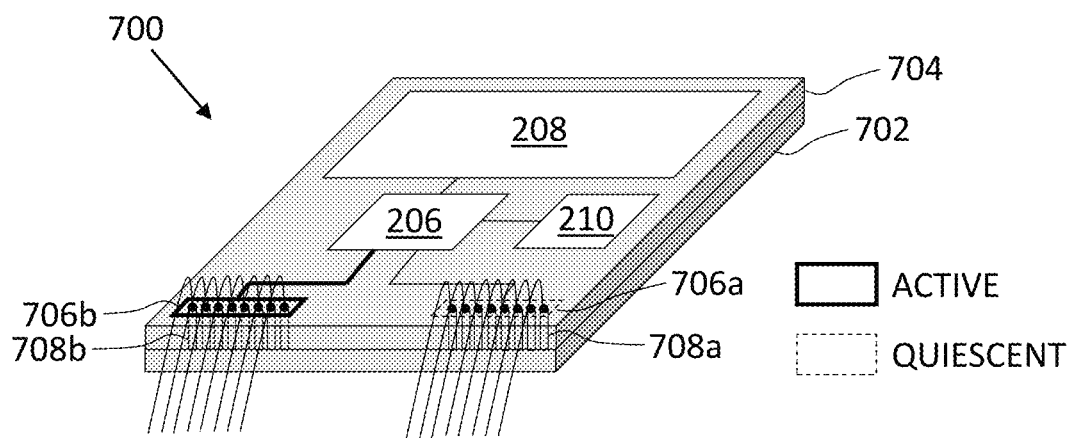
FIG. 7 illustrates a perspective view of a stack of two dies using vias to connect between I/O pins of different dies, in accordance with an embodiment of the present disclosure.

Wirebonds are commonly used to couple to the I/O ports of various dies in a multi-chip stack as illustrated herein. However, other coupling methods are possible as well without deviating from the scope or spirit of the embodiments disclosed herein. For example, FIG. 7 illustrates a multi-chip stack 700 where a first die 702 and a second die 704 are arranged directly over one another (e.g., no spacer between them). A first set of I/O ports 706a of second die 704 are bonded to the corresponding first set of I/O ports of first die 702 using metal vias 708a that extend through a thickness of second die 704 to couple with the lower I/O ports. Similarly, a second set of I/O ports 706b of second die 704 are bonded to the corresponding second set of I/O ports of first die 702 using metal vias 708b that extend through a thickness of second die 704 to couple with the lower I/O ports. By using metal vias to connect corresponding sets of I/O ports between dies, the total Z-height of the stack is decreased and the wirebonding is less complicated. The metal vias may be fabricated using standard dry or wet etching techniques to form the opening followed by electroplating with a suitable metal material to form the via.

Wirebonds may be used from the top sets of I/O ports as illustrated in FIG. 7, however other chip coupling techniques are also possible, such as flip-chip bonding or using a ball grid array (BGA) on the underside of multi-chip stack 700. Generally, any bonding methods can be used to interface with multi-chip stack 700. Although only two dies are shown in multi-chip stack 700, this is for illustrative purposes only and any number of dies can be used with corresponding I/O ports coupled together using metal vias.

Chip Package Design

Figure 8:
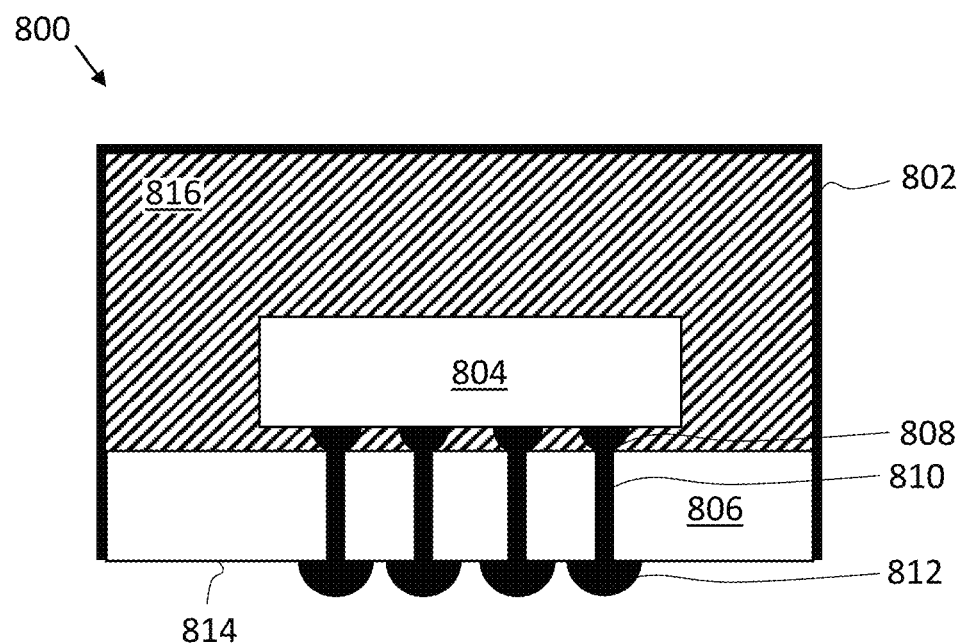
FIG. 8 illustrates an example chip package, in accordance with some embodiments of the present disclosure.

FIG. 8 illustrates an example embodiment of a chip package 800. Chip package 800 may include a housing 802 that protects one or more ICs 804 present within chip package 800. According to some embodiments, ICs 804 represent any of the multi-chip stacks disclosed herein. In some embodiments, housing 802 provides electromagnetic shielding and environmental protection for the components of chip package 800. In some embodiments, one or more ICs 804 include memory ICs. According to an embodiment, chip package 800 includes a package substrate 806 upon which one or more ICs 804 are bonded. One or more ICs 804 may be conductively coupled to package substrate 806 using first-level interconnects 808. In particular, conductive contacts at one face of package substrate 806 may be coupled to conductive contacts at faces of one or more ICs 804 by first-level interconnects 808. Some examples of first-level interconnects 808 include solder bumps, but any suitable first-level interconnects 808 may be used (e.g., pins in a pin grid array arrangement or lands in a land grid array arrangement). In some embodiments, a solder resist is disposed between first-level interconnects 808. In other examples, first-level interconnects 808 include wire bonds between one or more ICs 804 and package substrate 806.

Package substrate 806 may include a dielectric material, and may have conductive pathways (e.g., including conductive vias and lines) extending through the dielectric material between the faces, or between different locations on each face. Additional conductive contacts may be disposed at an opposite face of package substrate 806 for conductively contacting second-level interconnects 812. One or more vias 810 extend through a thickness of package substrate 806 to provide conductive pathways between one or more of first-level interconnects 808 to one or more of second-level interconnects 812. Vias 810 are illustrated as single straight columns through package substrate 806 for ease of illustration and, in some embodiments, vias 810 are fabricated by multiple smaller stacked vias, or are staggered at different locations across package substrate 806. Second-level interconnects 812 may be used to electrically connect the components of chip package 800 to other conductive contacts on, for example, a circuit board. In the illustrated embodiment, second-level interconnects 812 are solder balls (e.g., for a BGA arrangement), but any suitable second-level interconnects 812 may be used (e.g., pins in a pin grid array arrangement or lands in a land grid array arrangement). In some embodiments, a solder resist is disposed between second-level interconnects 812. Second level interconnects 812 may be arranged on an underside 814 of chip package 800. In some embodiments, chip package 800 represents each of memory devices 106 illustrated in FIG. 1. Thus, memory select signals from the memory controller may be provided to one or more ICs 804 by way of first-level interconnects 808 and second-level interconnects 812; likewise, mux select signals may be provided to the multiplexer circuits of the multi-chip stacks included in one or more ICs 804 by way of first-level interconnects 808 and second-level interconnects 812, according to some embodiments.

In some embodiments, a mold material 816 may be disposed around one or more ICs 804 included within housing 802 (e.g., between ICs 804 and package substrate 806 as an underfill material). Example materials that may be used for mold material 816 include epoxy mold materials, as suitable.

Example Computing System

Figure 9:
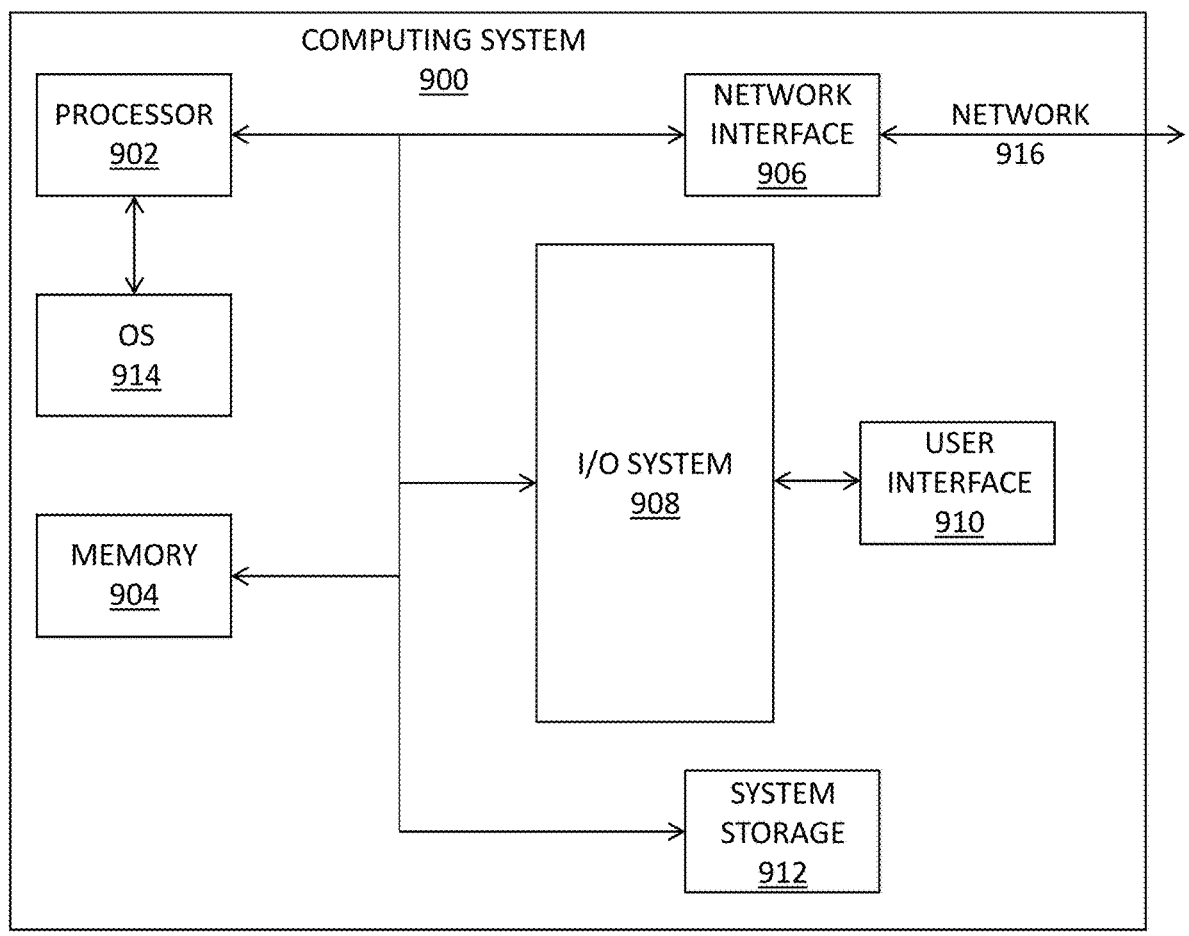
FIG. 9 illustrates an example computer system that can include one or more of the embodiments of the present disclosure.

FIG. 9 illustrates an example computing system 900 that may include one or more PCBs and/or one or more chip packages arranged in accordance with certain embodiments of the present disclosure. In some embodiments, computing system 900 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, computing system 900 may comprise any combination of a processor 902, a memory 904, a network interface 906, an input/output (I/O) system 908, a user interface 910, and a storage system 912. As can be further seen, a bus and/or interconnect is also provided to allow for communication between the various components listed above and/or other components not shown. Computing system 900 can be coupled to a network 916 through network interface 906 to allow for communications with other computing devices, platforms, or resources. Other componentry and functionality not reflected in the block diagram of FIG. 9 will be apparent in light of this disclosure, and it will be appreciated that other embodiments are not limited to any particular hardware configuration.

Processor 902 can be any suitable processor and may include one or more coprocessors or controllers to assist in control and processing operations associated with computing system 900. In some embodiments, processor 902 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 904 can be implemented using any suitable type of digital storage including, for example, flash memory and/or random access memory (RAM). In some embodiments, memory 904 may include various layers of memory hierarchy and/or memory caches. Memory 904 may be implemented as a volatile memory device such as, but not limited to, a RAM, dynamic RAM (DRAM), or static RAM (SRAM) device. Storage system 912 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 912 may comprise technology to increase the storage performance enhanced protection for valuable digital media when multiple hard drives are included. According to some embodiments of the present disclosure, either or both memory 904 and storage system 912 may use memory modules having memory devices that include multi-chip stack arrangements such as any of the multi-chip stack configurations disclosed herein.

Processor 902 may be configured to execute an Operating System (OS) 914 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS).

Network interface 906 can be any appropriate network chip or chipset which allows for wired and/or wireless connection between other components of computing system 900 and/or network 916, thereby enabling computing system 900 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 908 may be configured to interface between various I/O devices and other components of computing system 900. I/O devices may include, but not be limited to, a user interface 910. User interface 910 may include devices (not shown) such as a display element, touchpad, keyboard, mouse, and speaker, etc. I/O system 908 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 902 or any chipset of computing system 900.

It will be appreciated that in some embodiments, the various components of the computing system 900 may be combined or integrated in a system-on-a-chip (SoC) architecture. In some embodiments, the components may be hardware components, firmware components, software components or any suitable combination of hardware, firmware or software.

In various embodiments, computing system 900 may be implemented as a wireless system, a wired system, or a combination of both. When implemented as a wireless system, computing system 900 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, computing system 900 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

The terms "circuit" or "circuitry," as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., non-volatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a semiconductor die that includes one or more semiconductor devices, a first bank of I/O ports arranged along one side of the die; a second bank of I/O ports arranged along one side of the die; and a multiplexing circuit coupled between the first bank of I/O ports, the second bank of I/O ports, and the one or more semiconductor devices. The multiplexing circuit is configured to be changed from a first state to a second state. In the first state the first bank of I/O ports is coupled to the one or more semiconductor devices and the second bank of I/O ports is not coupled to the one or more semiconductor devices. In the second state the first bank of I/O ports is not coupled to the one or more semiconductor devices and the second bank of I/O ports is coupled to the one or more semiconductor devices.

Example 2 includes the subject matter of Example 1, wherein the one or more semiconductor devices comprise an array of memory cells.

Example 3 includes the subject matter of Example 1 or 2, wherein the one or more semiconductor devices comprise one or more processors.

Example 4 includes the subject matter of any of the preceding Examples, and further includes a fuse circuit coupled to the multiplexing circuit and configured to change the state of the multiplexing circuit, wherein the fuse circuit comprises one or more electronic fuses.

Example 5 includes the subject matter of Example 4, wherein the one or more electronic fuses are configured to permanently change the state of the multiplexing circuit between the first state and the second state.

Example 6 includes the subject matter of any of the preceding Examples, and further includes a select line input configured to receive a select signal from outside the semiconductor die, wherein the state of the multiplexing circuit is changed from the first state to the second state based on the received select signal. Note that some such embodiments may include mux setting circuitry that includes both on-chip fuse-based technology and one or more select pins for allowing receipt of one or more off-chip mux setting signals.

Example 7 includes the subject matter of any of the preceding Examples, and further includes: a third bank of I/O ports arranged along one side of the die; and a fourth bank of I/O ports arranged along one side of the die; wherein the multiplexing circuit is further coupled to the third bank of I/O ports and the fourth bank of I/O ports.

Example 8 includes the subject matter of Example 7, wherein the first and second states are included in a plurality of states in which the multiplexing circuit can be set, the plurality of states including: the first state where the first bank of I/O ports is coupled to the one or more semiconductor devices and the second, third, and fourth bank of I/O ports are not coupled to the one or more semiconductor devices; the second state where the second bank of I/O ports is coupled to the one or more semiconductor devices and the first, third, and fourth banks of I/O ports are not coupled to the one or more semiconductor devices; a third state where the third bank of I/O ports is coupled to the one or more semiconductor devices and the first, second, and fourth banks of I/O ports are not coupled to the one or more semiconductor devices; and a fourth state where the fourth bank of I/O ports is coupled to the one or more semiconductor devices and the first, second, and third banks of I/O ports are not coupled to the one or more semiconductor devices.

Example 9 is a chip package comprising the semiconductor die of any of the preceding Examples.

Example 10 is a printed circuit board comprising the chip package of Example 9.

Example 11 is a chip package that includes a plurality of semiconductor dies stacked on one another. Each of the semiconductor dies comprises: one or more semiconductor devices; a first plurality of I/O ports arranged along one side of the die; a second plurality of I/O ports arranged along one side of the die; and a multiplexing circuit coupled between the first plurality of I/O ports, the second plurality of I/O ports, and the one or more semiconductor devices. A state of the multiplexing circuit is configured to be changed from a first state where the first plurality of I/O ports is coupled to the one or more semiconductor devices and the second plurality of I/O ports is not coupled to the one or more semiconductor devices, to a second state where the first plurality of I/O ports is not coupled to the one or more semiconductor devices and the second plurality of I/O ports is coupled to the one or more semiconductor devices. The first plurality of I/O ports of each of the dies are coupled together, and the second plurality of I/O ports of each of the dies are coupled together.

Example 12 includes the subject matter of Example 11, wherein the plurality of semiconductor dies are stacked in a stair-step configuration.

Example 13 includes the subject matter of Example 11 or 12, wherein the first pluralities of I/O ports are coupled together using first metal vias, and the second pluralities of I/O ports are coupled together using second metal vias.

Example 14 includes the subject matter of any of Examples 11 through 13, wherein the first pluralities of I/O ports are coupled together using first wirebonds, and the second pluralities of I/O ports are coupled together using second wirebonds. Note that redundancy provided in cases where Examples 13 and 14 are combined may provide a failsafe measure.

Example 15 includes the subject matter of any of Examples 11 through 14, wherein the plurality of semiconductor dies are arranged in a vertical stack.

Example 16 includes the subject matter of Example 15, wherein the vertical stack further includes spacers between adjacent dies of the plurality of semiconductor dies, the spacers comprising dielectric material.

Example 17 includes the subject matter of any of Examples 11 through 16, wherein each of the semiconductor dies further comprises: a third plurality of I/O ports arranged along one side of the die; and a fourth plurality of I/O ports arranged along one side of the die; wherein the multiplexing circuit is further coupled to the third plurality of I/O ports and the fourth plurality of I/O ports.

Example 18 includes the subject matter of Example 17, wherein, for each die of the plurality of semiconductor dies, the states of the multiplexing circuit include: the first state where the first plurality of I/O ports is coupled to the one or more semiconductor devices and the second, third, and fourth pluralities of I/O ports are not coupled to the one or more semiconductor devices; the second state where the second plurality of I/O ports is coupled to the one or more semiconductor devices and the first, third, and fourth pluralities of I/O ports are not coupled to the one or more semiconductor devices; a third state where the third plurality of I/O ports is coupled to the one or more semiconductor devices and the first, second, and fourth pluralities of I/O ports are not coupled to the one or more semiconductor devices; and a fourth state where the fourth plurality of I/O ports is coupled to the one or more semiconductor devices and the first, second, and third pluralities of I/O ports are not coupled to the one or more semiconductor devices.

Example 19 includes the subject matter of any of Examples 11 through 18, and further includes one or both of: a fuse circuit coupled to the multiplexing circuit and configured to change the state of the multiplexing circuit; and a select line input configured to receive a select signal from outside the chip package, wherein the state of the multiplexing circuit is changed from the first state to the second state based on the received select signal. Note that some such embodiments may include mux setting circuitry that includes both on-chip fuse-based technology and one or more select pins for allowing receipt of one or more off-chip mux setting signals.

Example 20 is a printed circuit board comprising the chip package of any of Examples 11 through 19.

Example 21 is a computing system comprising the printed circuit board of Example 20.

Example 22 is a memory device, comprising: a plurality of semiconductor dies stacked on one another. Each of the semiconductor dies includes: an array of memory cells; a first bank of I/O ports arranged along one side of the die; a second bank of I/O ports arranged along one side of the die; and a multiplexing circuit coupled between the first bank of I/O ports, the second bank of I/O ports, and the array of memory cells. A state of the multiplexing circuit is configured to be changed from a first state where the first bank of I/O ports is coupled to the array of memory cells and the second bank of I/O ports is not coupled to the array of memory cells, to a second state where the first bank of I/O ports is not coupled to the array of memory cells and the second bank of I/O ports is coupled to the array of memory cells. The first banks of I/O ports of each of the dies are coupled together, and the second banks of I/O ports of each of the dies are coupled together.

Example 23 includes the subject matter of Example 22, wherein each of one or more of the semiconductor dies further comprises a fuse circuit coupled to the multiplexing circuit and configured to change the state of the multiplexing circuit, wherein the fuse circuit comprises one or more electronic fuses.

Example 24 includes the subject matter of Example 23, wherein the one or more electronic fuses are configured to permanently change the state of the multiplexing circuit between the first state and the second state.

Example 25 includes the subject matter of any of Examples 22 through 24, wherein each of one or more of the semiconductor dies further comprises: a third bank of I/O ports arranged along one side of the die; and a fourth bank of I/O ports arranged along one side of the die; wherein the multiplexing circuit is further coupled to the third bank of I/O ports and the fourth bank of I/O ports.

Example 26 includes the subject matter of Example 25, wherein the first and second states are included in a plurality of states in which the multiplexing circuit can be set, the plurality of states including: the first state where the first bank of I/O ports is coupled to the array of memory cells and the second, third, and fourth bank of I/O ports are not coupled to the array of memory cells; the second state where the second bank of I/O ports is coupled to the array of memory cells and the first, third, and fourth banks of I/O ports are not coupled to the array of memory cells; a third state where the third bank of I/O ports is coupled to the array of memory cells and the first, second, and fourth banks of I/O ports are not coupled to the array of memory cells; and a fourth state where the fourth bank of I/O ports is coupled to the array of memory cells and the first, second, and third banks of I/O ports are not coupled to the array of memory cells.

Example 27 includes the subject matter of any of Examples 22 through 26, further comprising a select line input to receive a select signal, wherein the state of the multiplexing circuit is changed between the first state and the second state based on the received select signal. Note that some embodiments may include mux setting circuitry that includes both on-chip fuse-based technology and one or more select pins for allowing receipt of one or more off-chip mux setting signals.

Example 28 is a chip package comprising the memory device of any of Examples 22 through 27.

Example 29 is a printed circuit board comprising the chip package of Example 28.

What is claimed is:

1. A semiconductor die comprising:
   one or more semiconductor devices;

a first bank of input/output (I/O) ports arranged along one side of the semiconductor die;
a second bank of I/O ports arranged along one side of the semiconductor die; and
a multiplexing circuit coupled between the first bank of I/O ports, the second bank of I/O ports, and the one or more semiconductor devices, the multiplexing circuit configured to be changed from a first state to a second state, wherein in the first state the first bank of I/O ports is actively coupled to the one or more semiconductor devices and the second bank of I/O ports is quiescently coupled to the one or more semiconductor devices, and in the second state the first bank of I/O ports is quiescently coupled to the one or more semiconductor devices and the second bank of I/O ports is actively coupled to the one or more semiconductor devices.

2. The semiconductor die of claim 1, wherein the one or more semiconductor devices comprise an array of memory cells and/or one or more processors.

3. The semiconductor die of claim 1, further comprising a fuse circuit coupled to the multiplexing circuit and configured to change a state of the multiplexing circuit, wherein the fuse circuit comprises one or more electronic fuses.

4. The semiconductor die of claim 3, wherein the one or more electronic fuses are configured to permanently change a state of the multiplexing circuit between the first state and the second state.

5. The semiconductor die of claim 1, further comprising a select line input configured to receive a select signal from outside the semiconductor die, wherein the state of the multiplexing circuit is changed from the first state to the second state based on the received select signal.

6. The semiconductor die of claim 1, further comprising:
a third bank of I/O ports arranged along one side of the semiconductor die; and
a fourth bank of I/O ports arranged along one side of the semiconductor die;
wherein the multiplexing circuit is further coupled to the third bank of I/O ports and the fourth bank of I/O ports.

7. The semiconductor die of claim 6, wherein the first and second states are included in a plurality of states in which the multiplexing circuit can be set, the plurality of states including: the first state where the first bank of I/O ports is actively coupled to the one or more semiconductor devices and the second, third, and fourth bank of I/O ports are quiescently coupled to the one or more semiconductor devices; the second state where the second bank of I/O ports is actively coupled to the one or more semiconductor devices and the first, third, and fourth banks of I/O ports are quiescently coupled to the one or more semiconductor devices; a third state where the third bank of I/O ports is actively coupled to the one or more semiconductor devices and the first, second, and fourth banks of I/O ports are quiescently coupled to the one or more semiconductor devices; and a fourth state where the fourth bank of I/O ports is actively coupled to the one or more semiconductor devices and the first, second, and third banks of I/O ports are quiescently coupled to the one or more semiconductor devices.

8. A chip package comprising the semiconductor die of claim 1.

9. A printed circuit board comprising the chip package of claim 8.

10. A chip package comprising:
a plurality of semiconductor dies stacked on one another, each of the semiconductor dies comprising one or more semiconductor devices,
a first plurality of I/O ports arranged along one side,
a second plurality of I/O ports arranged along one side, and
a multiplexing circuit coupled between the first plurality of I/O ports, the second plurality of I/O ports, and the one or more semiconductor devices, wherein a state of the multiplexing circuit is configured to be changed from a first state where the first plurality of I/O ports is actively coupled to the one or more semiconductor devices and the second plurality of I/O ports is quiescently coupled to the one or more semiconductor devices, to a second state where the first plurality of I/O ports is quiescently coupled to the one or more semiconductor devices and the second plurality of I/O ports is actively coupled to the one or more semiconductor devices;
wherein the first plurality of I/O ports of each of the semiconductor dies are coupled together and wherein the second plurality of I/O ports of each of the semiconductor dies are coupled together.

11. The chip package of claim 10, wherein the plurality of semiconductor dies are stacked in a stair-step configuration.

12. The chip package of claim 10, wherein the first pluralities of I/O ports are coupled together using first metal vias, and the second pluralities of I/O ports are coupled together using second metal vias.

13. The chip package of claim 10, wherein the first pluralities of I/O ports are coupled together using first wirebonds, and the second pluralities of I/O ports are coupled together using second wirebonds.

14. The chip package of claim 10, wherein the plurality of semiconductor dies are arranged in a vertical stack.

15. The chip package of claim 14, wherein the vertical stack further includes spacers between adjacent dies of the plurality of semiconductor dies, the spacers comprising dielectric material.

16. The chip package of claim 10, wherein each of the semiconductor dies further comprises:
a third plurality of I/O ports arranged along one side; and
a fourth plurality of I/O ports arranged along one side;
wherein the multiplexing circuit is further coupled to the third plurality of I/O ports and the fourth plurality of I/O ports;
wherein, for each semiconductor die of the plurality of semiconductor dies, the state of the multiplexing circuit is configured to be changed from the first state where the first plurality of I/O ports is actively coupled to the one or more semiconductor devices and the second, third, and fourth pluralities of I/O ports are quiescently coupled to the one or more semiconductor devices; the second state where the second plurality of I/O ports is actively coupled to the one or more semiconductor devices and the first, third, and fourth pluralities of I/O ports are quiescently coupled to the one or more semiconductor devices; a third state where the third plurality of I/O ports is actively coupled to the one or more semiconductor devices and the first, second, and fourth pluralities of I/O ports are quiescently coupled to the one or more semiconductor devices; and a fourth state where the fourth plurality of I/O ports is actively coupled to the one or more semiconductor devices and the first, second, and third pluralities of I/O ports are quiescently coupled to the one or more semiconductor devices.

17. The chip package of claim 10, further comprising one or both of: a fuse circuit coupled to the multiplexing circuit and configured to change the state of the multiplexing circuit; and a select line input configured to receive a select signal from outside the chip package, wherein the state of the multiplexing circuit is changed from the first state to the second state based on the received select signal.

18. A memory device, comprising:
- a plurality of semiconductor dies stacked on one another, each of the semiconductor dies comprising
  - an array of memory cells,
  - a first bank of I/O ports arranged along one side,
  - a second bank of I/O ports arranged along one side, and
  - a multiplexing circuit coupled between the first bank of I/O ports, the second bank of I/O ports, and the array of memory cells, wherein a state of the multiplexing circuit is configured to be changed from a first state where the first bank of I/O ports is actively coupled to the array of memory cells and the second bank of I/O ports is quiescently coupled to the array of memory cells, to a second state where the first bank of I/O ports is quiescently coupled to the array of memory cells and the second bank of I/O ports is actively coupled to the array of memory cells;
- wherein the first banks of I/O ports of each of the semiconductor dies are coupled together, and wherein the second banks of I/O ports of each of the semiconductor dies are coupled together.

19. The memory device of claim 18, wherein each of one or more of the semiconductor dies further comprises a fuse circuit coupled to the multiplexing circuit and configured to change the state of the multiplexing circuit, wherein the fuse circuit comprises one or more electronic fuses.

20. The memory device of claim 18, wherein each of one or more of the semiconductor dies further comprises a select line input to receive a select signal, wherein the state of the multiplexing circuit is changed between the first state and the second state based on the received select signal.

* * * * *